(12) United States Patent
Hofmann et al.

(10) Patent No.: US 6,316,315 B1
(45) Date of Patent: Nov. 13, 2001

(54) METHOD FOR FABRICATING A MEMORY CELL HAVING A MOS TRANSISTOR

(75) Inventors: Franz Hofmann, München; Josef Willer, Riemerling, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/642,328

(22) Filed: Aug. 21, 2000

Related U.S. Application Data

(63) Continuation of application No. PCT/DE98/03716, filed on Dec. 17, 1998.

(30) Foreign Application Priority Data

Feb. 20, 1998 (DE) .............................................. 198 07 188

(51) Int. Cl.⁷ .................................................. H01L 29/788
(52) U.S. Cl. .......................... 438/259; 438/257; 438/201; 438/211
(58) Field of Search ................................... 438/263, 259, 438/257, 211, 201

(56) References Cited

U.S. PATENT DOCUMENTS

| | | |
|---|---|---|
| 5,049,515 | 9/1991 | Tzeng . |
| 5,242,848 | 9/1993 | Yeh . |
| 5,488,244 | 1/1996 | Quek et al. . |
| 5,495,441 | 2/1996 | Hong . |

FOREIGN PATENT DOCUMENTS

| | | |
|---|---|---|
| 0 718 895 A2 | 6/1996 | (EP) . |
| 07221206 | 8/1995 | (JP) . |
| 08321563 | 12/1996 | (JP) . |

*Primary Examiner*—Vu A. Le
*Assistant Examiner*—Beth E. Owens
(74) *Attorney, Agent, or Firm*—Herbert L. Lerner; Laurence A. Greenberg; Werner H. Stemer

(57) ABSTRACT

A memory cell has a vertical MOS transistor which contains a first electrically insulated gate electrode and a second gate electrode. The second gate electrode is partially disposed in a trench whose sidewall is adjoined by the MOS transistor. The first gate electrode is disposed outside the trench and has a tip at an edge of the trench. The tip enables programming with a reduced current flow. The memory cell can be fabricated by self-aligning fabrication with an area requirement of six $F^2$.

6 Claims, 6 Drawing Sheets

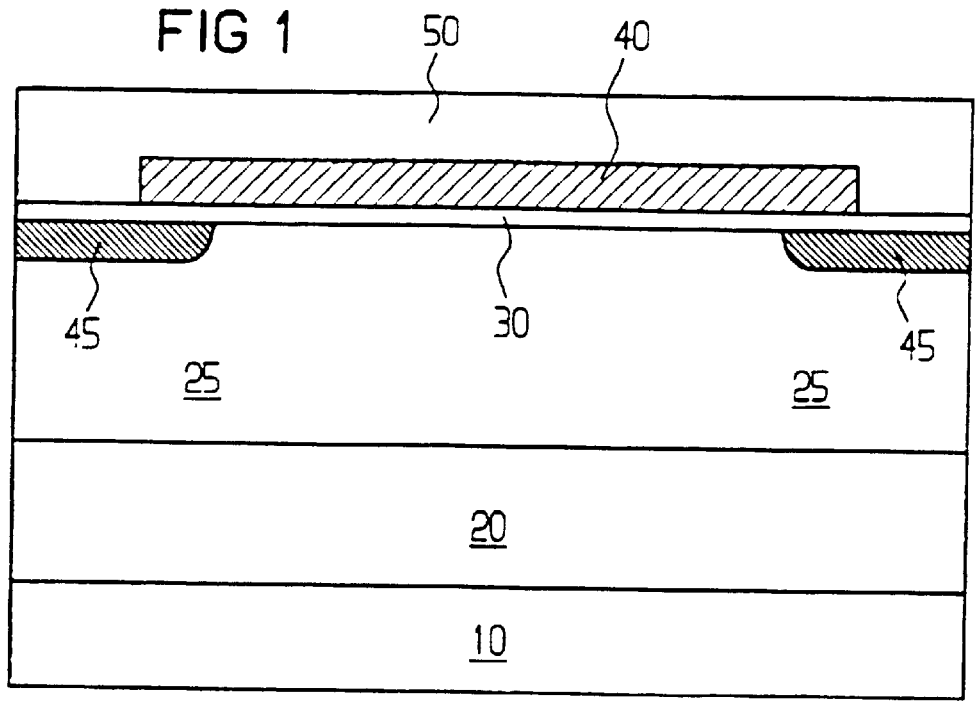
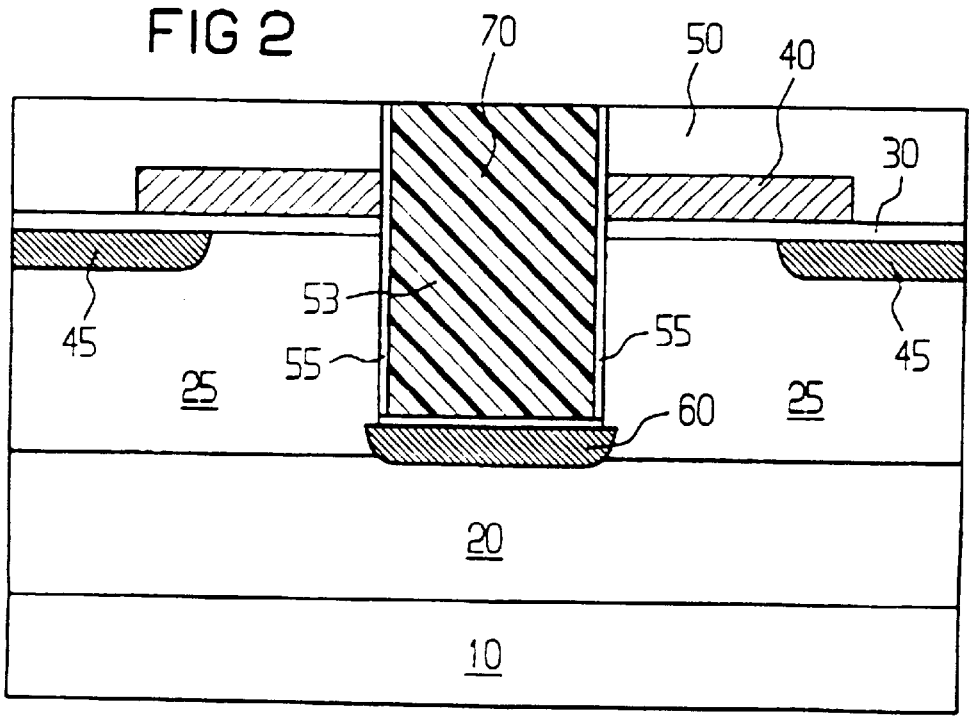

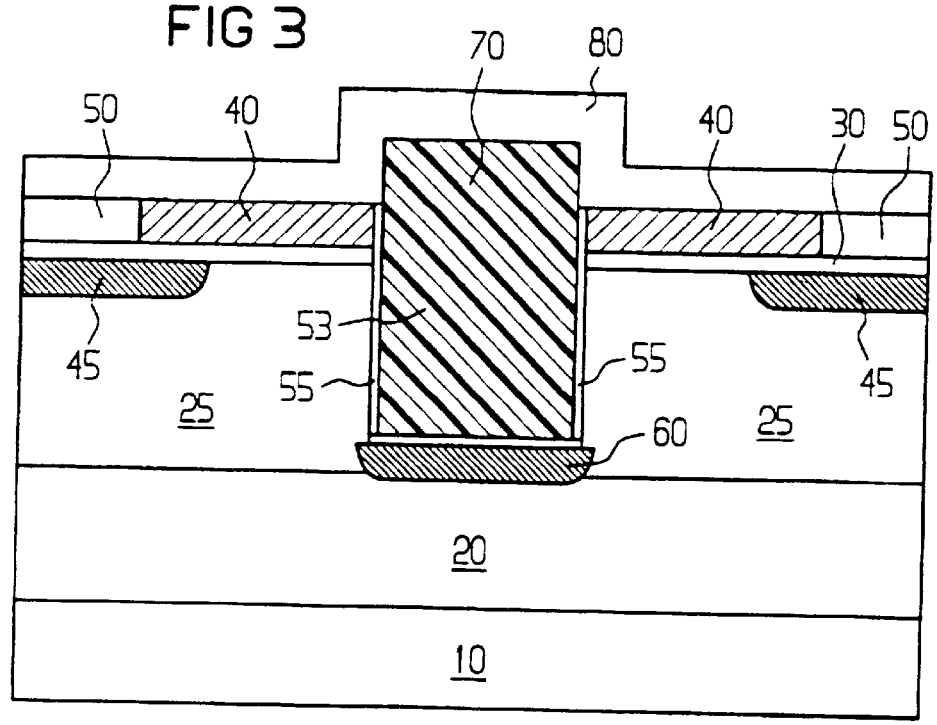
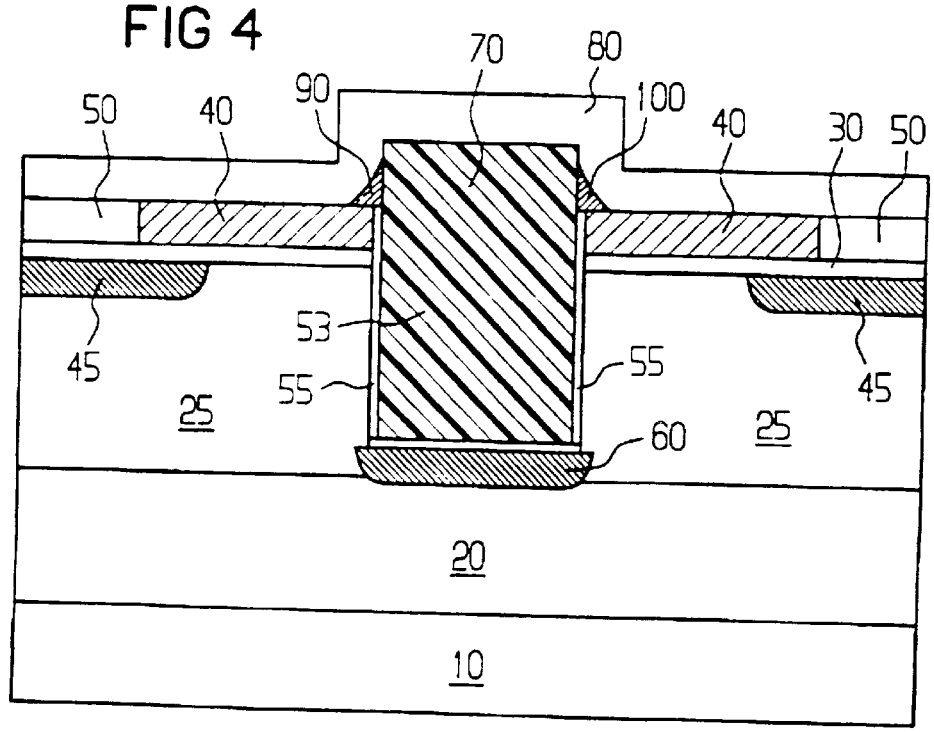

METHOD FOR FABRICATING A MEMORY CELL HAVING A MOS TRANSISTOR

CROSS-REFERENCE TO RELATED APPLICATION:

This is a continuation of copending International Application PCT/DE98/03716, filed Dec. 17, 1998, which designated the United States.

BACKGROUND OF THE INVENTION

Field of the Invention

The invention relates to a memory cell having at least one MOS transistor. The transistor contains a source, a first gate electrode, a second gate electrode, a drain and a channel. The first gate electrode is insulated and can contain an electric charge and a control voltage can be applied to the second gate electrode. The source, the drain and the channel are formed by differently doped regions of a semiconductor substrate and at least one dielectric layer which forms a gate dielectric is situated between the semiconductor substrate and the gate electrodes.

The invention furthermore relates to a method for fabricating such a memory cell.

Such a memory cell is described in U.S. Patent No. 5,242,848. In this case, the first gate electrode extends in a planar manner on a dielectric layer and has a tip. The second gate electrode has a plurality of regions, a lower region being disposed on the same dielectric layer as the first gate electrode and an upper region of the second gate electrode is disposed above the first gate electrode in regions. This configuration produces locally a particularly large electric field gradient on the surface of the first gate electrode. A tip effect promotes Fowler-Nordheim tunneling. Fowler-Nordheim tunneling involves charge transport through an insulator. The charge transport through the insulator is generally dependent to a great extent on the applied electric field. In the case of Fowler-Nordheim tunneling, the electric current density j has the particular dependence $j = C_1 x_\epsilon^2 \exp(-\epsilon_0/\epsilon)$ where $\epsilon$ is the electric field strength and $C_1$ and $\epsilon_0$ are constants dependent on a effective mass of the charge carriers and a height of a barrier layer. By virtue of the high electric field density, the memory cell of the generic type can be electrically erased in a particularly simple manner.

It has been shown, however, that, for feature sizes of 0.25 $\mu$m or less, the memory cell does not have the necessary reliability for memory cells.

SUMMARY OF THE INVENTION

It is accordingly an object of the invention to provide a memory cell having a MOS transistor and a method for fabricating it which overcome the above-mentioned disadvantages of the prior art devices and methods of this general type, which is realizable with feature sizes of 0.25 $\mu$m or less and is intended to be able to be fabricated in the simplest possible manner.

With the foregoing and other objects in view there is provided, in accordance with the invention, a memory cell, which includes a substrate having differently doped regions and at least one MOS transistor formed on the substrate. The MOS transistor has a source and a first gate electrode being an insulated first gate electrode that can contain an electric charge. The first gate electrode additionally has at least one tip. A second gate electrode is provided for receiving a control voltage and faces the tip of the first gate electrode. The second gate electrode has a first region penetrating into the substrate and a second region projecting above the substrate. The transistor further has a drain and a channel; the source, the drain and the channel are formed in the differently doped regions of the substrate; and at least one dielectric layer forming a gate dielectric is disposed between the substrate and the first and second gate electrodes.

According to the invention, the object is achieved by virtue of the fact that a memory cell of the generic type is furnished such that the second gate electrode, at least in a region, penetrates into the semiconductor substrate. The first gate electrode has a tip facing the second gate electrode.

Preferably, the second gate electrode is at least partially disposed in the trench along whose sidewall a conductive channel can form. The tip of the first gate electrode is disposed at the edge of the trench.

The invention provides for the MOS transistor of the memory cell to be configured in such a way that it has two gate electrodes which are spatially separate from one another, the first gate electrode containing a programmed-in electric charge, and the second gate electrode being connected to a line. In this case, the second gate electrode is configured in such a way that it can penetrate entirely, or in a partial region, into the semiconductor substrate.

The first gate electrode is preferably configured as a floating gate electrode. The term floating gate electrode indicates that the first gate electrode can be provided with a variable electric charge. The first gate electrode is situated at least in regions between the second gate electrode and the channel of the MOS transistor. By virtue of this configuration, the threshold voltage of the memory cell having the MOS transistor and the floating gate electrode depends on the charge situated on the floating gate electrode.

A preferred embodiment of the memory cell according to the invention is distinguished by the fact that the source is disposed more deeply in the semiconductor substrate than the drain. In addition, the second gate electrode penetrates into the semiconductor substrate in such a way that the second gate electrode is situated above the source at least in sections.

In accordance with an added feature of the invention, the second gate electrode has at least one recess formed therein and the tip penetrates into the recess in the second gate electrode.

It is particularly advantageous that the second gate electrode, in a further region, projects above the semiconductor substrate.

A particularly compact cell array can be achieved by virtue of the fact that the first gate electrode runs parallel to the second gate electrode at least in sections.

This makes it possible for a single gate electrode to drive two preferably vertical MOS transistors. The gate electrode is the select gate electrode (Select Gate), which is designated as the second gate electrode in this case.

A tip effect can be achieved in a particularly favorable manner by virtue of the fact that that region of the second gate electrode which penetrates into the semiconductor substrate is formed by a vertical projection of the second gate electrode, and that another region of the second gate electrode extends essentially parallel to a surface of the semiconductor substrate.

A compact configuration in which the second gate electrode (Select Gate) drives two first (floating) gate electrodes can be obtained in a particularly simple and expedient manner by virtue of the fact that the first gate electrode contains a section, which extends parallel to the vertical part of the second gate electrode.

A configuration with a pronounced tip effect and correspondingly promoted Fowler-Nordheim tunneling can be obtained by virtue of the fact that the first gate electrode extends essentially parallel to a surface of the semiconductor substrate, and that the first gate electrode has at least one tip in another region, which is oriented vertically with respect to the semiconductor substrate.

A further increase in the tip effect can be obtained by virtue of the fact that the tip of the first gate electrode penetrates into at least one recess in the second gate electrode.

The invention furthermore relates to a method for fabricating a memory cell having at least one MOS transistor. The method includes depositing a first dielectric layer for forming a first gate dielectric, a first electrically conductive layer for forming a first gate electrode, a second dielectric layer and a second electrically conductive layer for forming a second gate electrode on a semiconductor substrate. In addition, differently doped regions are formed in the semiconductor material for creating a source, a drain and a channel. The method is distinguished according to the invention by the fact that a tip is produced on the first electrically conductive layer, and that the second gate electrode is produced in such a way that it, at least in a region, penetrates into the semiconductor substrate.

The method can be carried out in a particularly advantageous manner in such a way that first the first dielectric layer and then the electrically conductive layer serving as the first gate electrode in the finished memory cell are produced on the semiconductor substrate. Next, a region from the first electrically conductive layer and the underlying region of the dielectric layer and also of the semiconductor substrate is removed in a later process step.

Such removal can be effected for example by one or more etching processes. The etching processes are chosen such that they enable the semiconductor substrate to be etched as far as possible anisotropically.

In accordance with an additional feature of the invention, a filling structure is deposited in a region in which the first electrically conductive layer, the first dielectric layer and the substrate have been removed. The filling structure projects above the first electrically conductive layer. A tip is then formed on each side wall of the filling structure projecting above the first electrically conductive layer. The filling structure is then selectively removed and a second gate dielectric and at least part of the second gate electrode is formed in the region.

In accordance with a concomitant feature of the invention, a semiconductor layer is deposited covering side walls of the filling structure and the semiconductor layer is oxidized isotropically for forming the tip. An oxidized part of the semiconductor layer is selectively removed resulting in non-oxidized residues of the semiconductor layer remaining that constitute the tip.

A compact cell in which the second gate electrode (the Select Gate) controls two different transistors is preferably produced in a self-aligned process. Precisely defined geometries of the gate electrodes and their surroundings are obtained by this method.

Other features which are considered as characteristic for the invention are set forth in the appended claims.

Although the invention is illustrated and described herein as embodied in a memory cell having a MOS transistor and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view through a semiconductor substrate after application of a first dielectric layer, a first electrically conductive layer and a second dielectric layer;

FIG. 2 is a cross-sectional view through the semiconductor substrate after etching and filling of a trench;

FIG. 3 is a cross-sectional view through the semiconductor substrate after selective etching-away of the semiconductor substrate and of the first insulation layer and application of a second semiconductor layer;

FIG. 4 is a cross-sectional view through the semiconductor substrate after isotropic oxidation of the second semiconductor layer;

DESCRIPTION OF THE PREFERRED EMBODIMENTS

Figure 5:
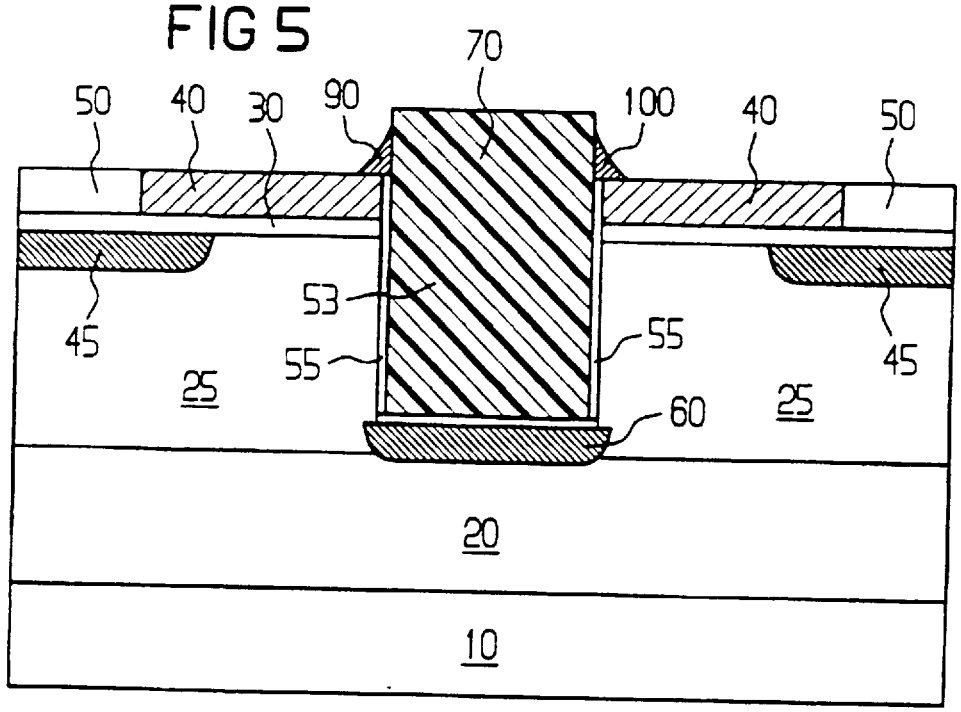
FIG. 5 is a cross-sectional view through the semiconductor substrate after etching-away of the semiconductor layer.

In all the figures of the drawing, sub-features and integral parts that correspond to one another bear the same reference symbol in each case. Referring now to the figures of the drawing in detail and first, particularly, to FIG. 9 thereof, there is shown a particularly preferred embodiment of the invention that begins with an insulation for active regions. The insulation can be effected by producing an insulation structure for example using a local oxidation of silicon (LOCOS) or a shallow trench isolation (STI) process. The insulation structure contains isolation trenches 170 and insulation regions 180.

FIG. 1 shows well regions 20 and regions forming a channel 25 subsequently produced in a semiconductor substrate 10, preferably by the implantation of ions. By way of example, boron ions are implanted in the case of an NMOS transistor. Phosphorus is implanted, for example, in the case of a PMOS transistor.

A first dielectric layer, which forms first gate dielectric 30 in the finished transistor, is subsequently grown. The first dielectric layer is preferably oxidized.

A semiconductor layer, which forms a first gate electrode 40 in a later processing step, for example made of polycrystalline silicon, is then deposited as a first electrically conductive layer 40. The semiconductor layer 40 is patterned by known photolithographic process steps. In the next process step, in order to form drain regions, a dopant is implanted with a gently rising concentration (LDD implantation). Such a shallow concentration gradient in the region of the regions that are intended for forming a drain 45 prolongs the lifetime of the transistor. After the patterning of the semiconductor layer 40 which forms the first gate electrode 40 in a later processing step, a first insulation layer 50 is deposited. In this case, the first insulation layer 50 has a thickness large enough to cover an entire area of the semiconductor layer 40. By way of example, the first insulation layer 50 has a thickness of approximately 600 μm. The first insulation layer 50 may be composed for example of an oxide deposited according to a tetraethyl orthosilicate (TEOS) method. To that end, tetraethyl orthosilicate: $Si(OC_2H_5)_4$ is converted into $SiO_2$ preferably at a temperature of about 700° C. and a pressure of 40 Pa.

The first insulation layer 50 is subsequently planarized by a suitable planarization method, for example by chemical mechanical polishing (CMP). This processing state is illustrated in FIG. 1.

This is followed, by a mask that is not illustrated, by etching of a trench 53 (FIG. 2), which penetrates through the first insulation layer 50, the first gate electrode 40 and the first gate dielectric 30 into the semiconductor substrate. The penetration is realized as far as the region forming the channel 25.

After the etching of the trench 53, a dopant, for example arsenic for forming a source 60, is implanted in the region of the bottom of the trench 53.

In the example illustrated, a MOS transistor is fabricated in such a way that the source 60 is situated underneath a second gate electrode 120 (FIG. 7), while the drains 45 are situated in the region of a surface of the semiconductor substrate 10. The drains 45 form bit lines in the finished memory cell configuration.

A protective oxide layer 55 is subsequently applied and patterned in such a way that it covers the bottom and the walls of the trench 53. The protective oxide layer 55 is preferably deposited according to the TEOS method. In this case, tetraethyl orthosilicate $Si(OC_2H_5)_4$ is converted into $SiO_2$ at a temperature of about 700° C. and a preferred pressure of 40 Pa. The protective oxide layer 55 encapsulates a filling material 70, which is filled into the trench 53 in a next method step.

The trench 53 is subsequently filled with the filling material 70, for example made of silicon nitride $Si_3N_4$. This is then followed by a planarization operation, for example by the CMP step, with the result that the filling material 70 has a planar surface. This processing state is illustrated in FIG. 2.

An etching process is carried out to remove the first insulation layer 50 above the first gate electrode 40 (FIG. 3). The etching process is preferably anisotropic dry etching which can be performed using a suitable etching gas, for example $CF_4$ or $CHF_3$, and, if appropriate, a suitable addition such as $O_2$.

A second semiconductor layer 80, for example made of polycrystalline silicon, is subsequently deposited conformally. This processing state is illustrated in FIG. 3.

The first gate electrode 40 and the second semiconductor layer 80 are formed at right angles. They extend perpendicularly to the illustrated plane of the drawing.

The second semiconductor layer 80, which initially has a continuous form, is subsequently interrupted, which can be done by a known photolithographic process steps. The second semiconductor layer 80 is interrupted in order to ensure that the first gate electrode 40 is isolated.

The second semiconductor layer 80 is interrupted in a plane (not illustrated) parallel to the cross-sectional area illustrated.

Isotropic oxidation of the second semiconductor layer 80 is subsequently effected. The oxidation is effected to such an extent that only in the boundary region with respect to the trench 53 are tips 90 and 100 (FIG. 4) of the second semiconductor layer 80 not converted into an oxide.

The tips 90 and 100 have the form of cutting edges whose longitudinal direction extends perpendicularly to the plane of the illustration.

The method has been described above for the particularly preferred case where the tips 90 and 100 remain as nonoxidized residues of the second semiconductor layer 80. However, the tips 90 and 100 can also be produced in another way. Thus, by way of example, it is also possible to carry out the method with the tips 90 and 100 being etched out. In this case all that is necessary is a further process step to form an additional insulation layer above the first gate electrode. Thus, the tips 90 and 100 are alternatively formed by etching the semiconductor layer 80 in such a way that the tips 90 and 100 remain. An isotropic etching process is expediently carried out for this purpose, which etching process can be performed either as a wet-chemical etching process or as a dry etching process. The result of such an etching process is illustrated in FIG. 5.

Figure 6:
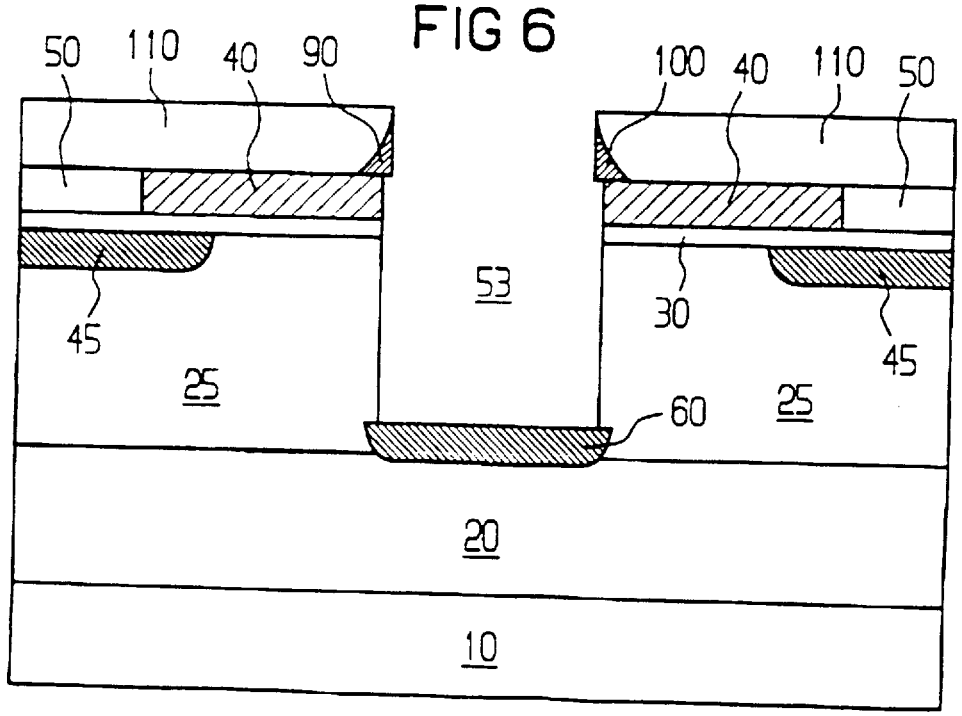
FIG. 6 is a cross-sectional view through the semiconductor substrate after deposition of a second insulation layer and removal of the filling material contained in the trench.

A second insulation layer 110 is subsequently applied. To that end, by way of example, tetraethyl orthosilicate (TEOS; $Si(OC_2H_5)_4$) can be converted into $SiO_2$ at a temperature in the region of 700° C. and a pressure in the range of from 10 Pa to 100 Pa, preferably 40 Pa. The thickness of the second insulation layer 110 is at least as large as the height of the tips 90 and 100. If the tips 90 and 100 were produced as nonoxidized residues of the second semiconductor layer 80, then the oxidized second semiconductor layer 80 can be used instead of or in addition to the second further insulation layer 110. A process of chemical mechanical polishing (CMP) is then carried out, the filling material 70, that is to say in this case a nitride filling, of the trench 53 serving as a stop layer. The filling material 70 is subsequently removed wet-chemically. In this case, the protective oxide layer 55 is also removed. This processing state is illustrated in FIG. 6.

Figure 7:
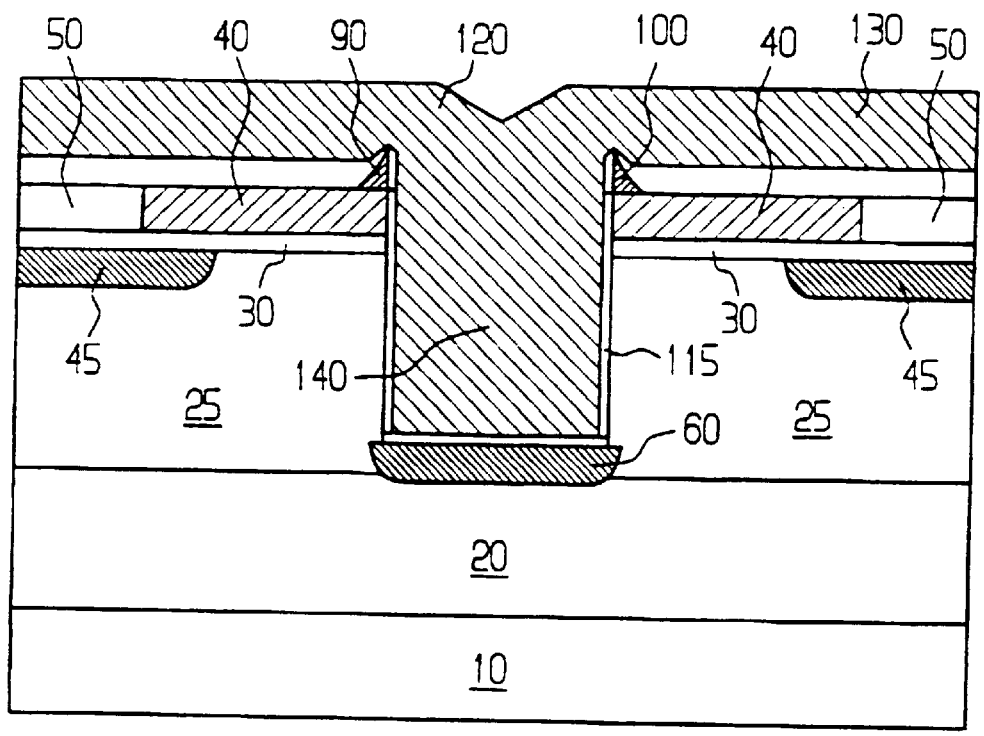
FIG. 7 is a cross-sectional view through the semiconductor substrate after application of a second electrically conductive material, which forms the second gate electrode in the completed memory cell.

Thermal oxidation is subsequently effected in the trench 53, a second gate dielectric 115 thereby being formed (FIG. 7). The thermal oxidation is effected in an oxygen-containing atmosphere which, if appropriate, contains additions, for example of HCl or nitrogen. The oxidation is preferably effected at a temperature in the range of from 800° C. to 900° C. A semiconductor material that forms the second gate electrode 120 is then applied to the second insulation layer 110.

The semiconductor material is polycrystalline silicon, for example. The semiconductor material is doped with a dopant, for example phosphorus, with a concentration preferably of about $1 \times 10^{21}$ cm$^{-3}$.

The second gate electrode 120 has a region 130 extending in planiform fashion and a projection 140 perpendicular thereto, which penetrates into the trench 53. The region 130 of the second gate electrode 120 extends essentially parallel to the first gate electrode 40, but reaches beyond the latter.

The tips 90 and 100 project into a transition zone between the projection 140 and the planiform region 130 of the second gate electrode 120 in such a way that the second gate electrode 120 has an indentation 150 at these points. The indentation 150 is shown enlarged in the detail view in FIG. 8. In this case, it is also evident that the tip 100 has a section 105 extending essentially parallel to the projection 140 of the second gate electrode 120. The section 105 coming closest in the vicinity of the area of contact between the projection 140 and the planiform region 130 of the second gate electrode.

A vertical transistor is formed by the drain 45, the source 60, the channel 25, the second gate dielectric 115 and the second gate electrode 120.

The memory cell thus fabricated is completed by customary process steps, for example by application of an intermediate oxide, contact hole etching and production of a metallization layer.

Figure 8:
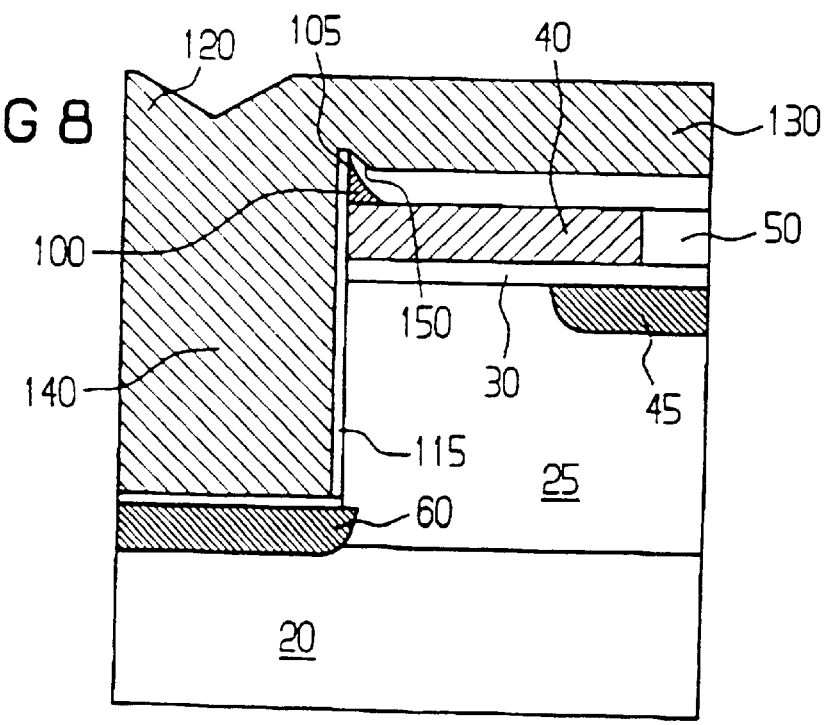
FIG. 8 is a cross-sectional view of a detail shown in FIG. 7 in a junction region between a first gate electrode and the second gate electrode.

The finished fabricated memory cell can be programmed in the manner explained below with reference to FIG. 8. To that end, charge carriers are generated on the source 60 that are injected into the first (floating) gate electrode 40 on account of a potential difference at the boundary with respect to the first (floating) gate electrode 40. Given suitable voltage conditions in which the second (Select Gate) gate electrode 120 has a voltage lying somewhat above the threshold voltage of the vertical transistor formed by the drain 45, the source 60, the channel 25, the second gate dielectric 115 and the second gate electrode 120, there is only a very small current flow. This constitutes a difference from known programming with hot charge carriers, in which the transistor is operated at saturation voltage. The voltage present at the second gate electrode 120 can be chosen in a manner dependent on a desired programming time in the case of the memory cell according to the invention. This voltage varies between an externally applied operating voltage and the threshold voltage of the vertical transistor. If the voltage is equal to the threshold voltage, then the programming time is long but only a very small current flows. Therefore, the power required for the switching operation is very low. By increasing the voltage, the programming time is shortened but the power consumption is increased. By virtue of the variability of programming time and power consumption, the memory cell configuration is suitable for a multiplicity of areas of application.

A preferred application example is explained below. The voltage is 0 V at the source 60, 12 V at the drain 45 and 1.5 V at the second gate electrode 120. The memory cell is erased as a result of tunneling between the tip 100 and the second gate electrode 120. On account of the tip effect, very high electric fields occur here and a current flow takes place only at the tip 100.

A memory cell of this type is distinguished by its small area requirement of 6 $F^2$, for example.

The process for fabricating it that has been explained is particularly.expedient because it takes place in a self-aligned manner and thus ensures a defined geometry of the component parts of the memory cell. In particular, a defined channel length is obtained in this way.

In principle, however, it is also possible to fabricate the memory cell by a different method.

A plan view of the memory cell configuration and a preferred circuit for electrical connection of the memory cell configuration are explained below.

Figure 9:
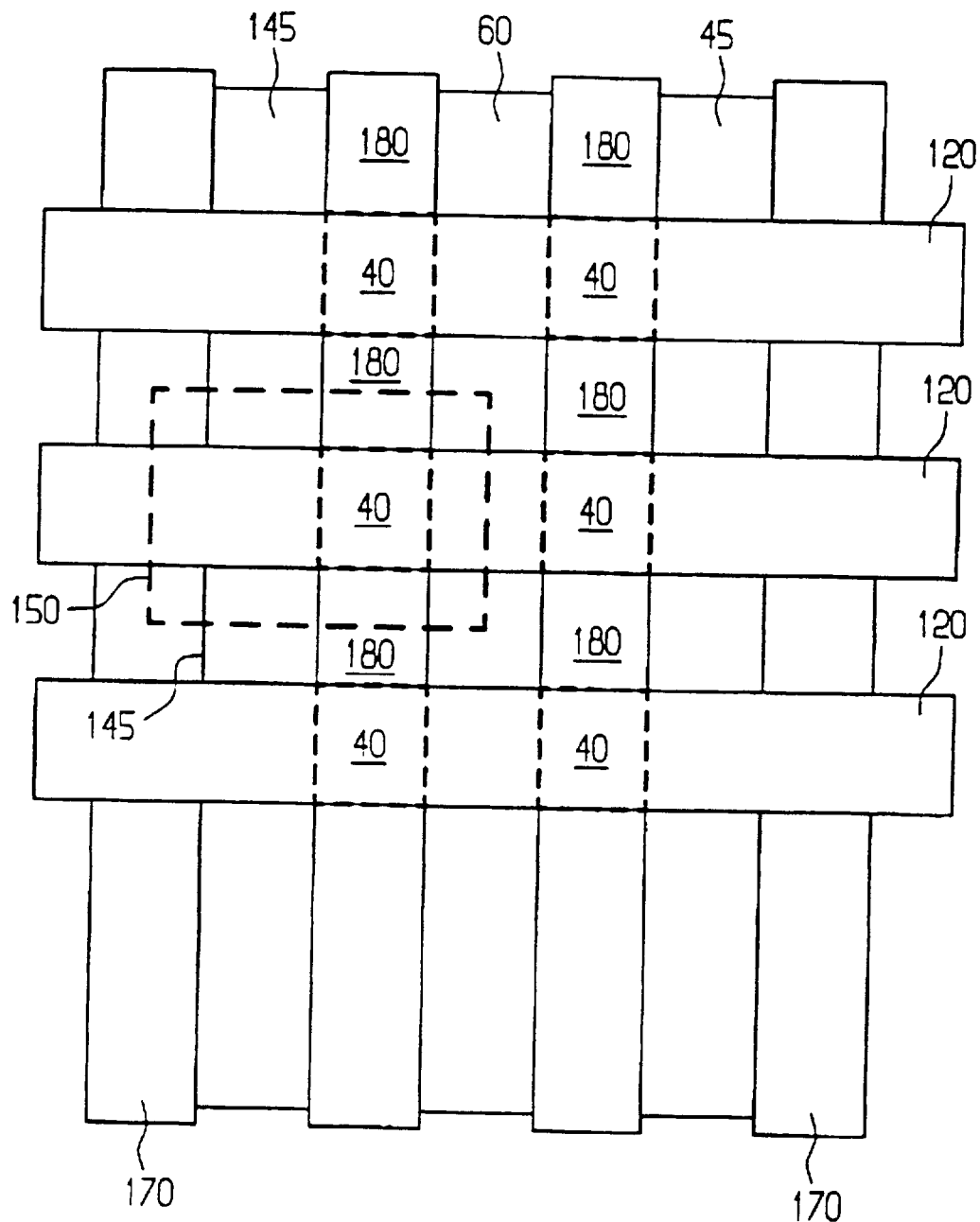
FIG. 9 is a plan view of the memory cell configuration containing a plurality of memory cells.

The memory cell configuration illustrated in FIG. 9 is a double AND. A plurality of memory cells 150 each having a cell size of 6 $F^2$ are illustrated in this case. A width of the individual squares that form the source 60 or the drains 45 and 145 corresponds to the minimum feature size F of the process for fabricating the memory cell.

In this case, the drains 45 and 145 form bit lines. The crossover points between the bit lines and word lines form individual memory cells of the memory cell configuration. The second gate electrodes 120 have a continuous form, so that they each form a word line driving a plurality of MOS transistors.

The source 60 and two bit lines formed by drains 45 and 145 are bounded laterally by the isolation trenches 170. The isolation trenches 170 insulate the bit lines from one another. In this case, the isolation trenches 170 run parallel to the bit lines. The further insulation regions 180 serve for insulating the first gate electrodes 40.

Figure 10:
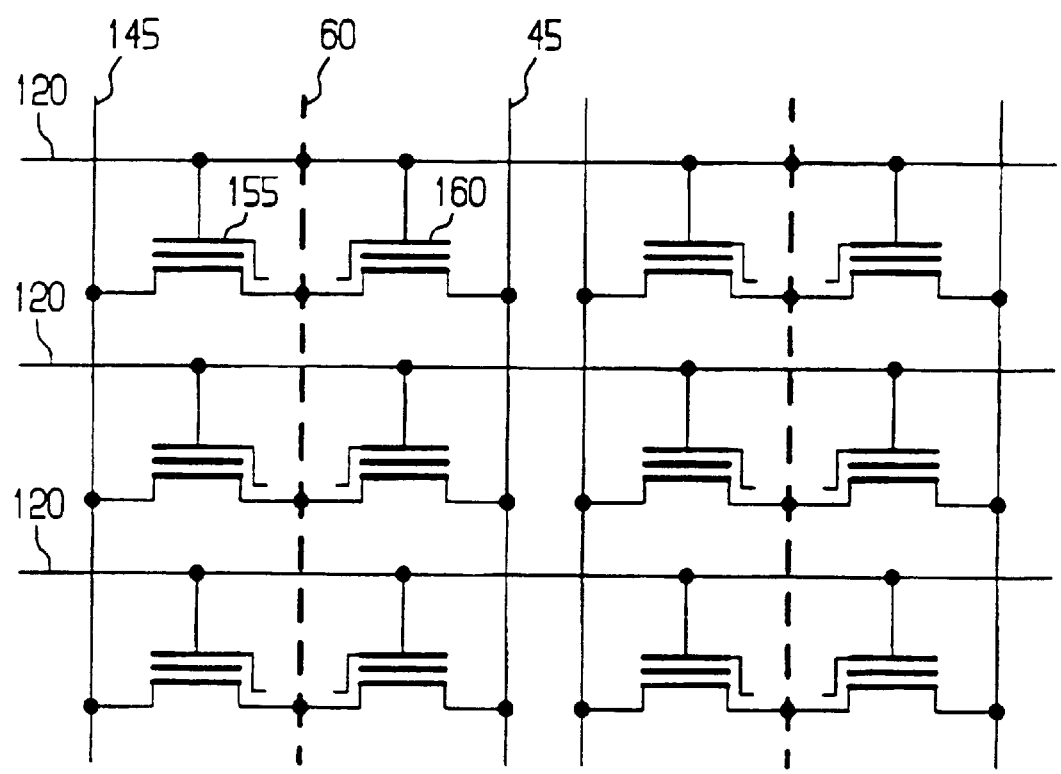
FIG. 10 is a circuit diagram of the memory cell configuration.

The circuit diagram of the memory cell configuration illustrated in FIG. 9 is illustrated in FIG. 10, the second drain being identified by the reference numeral 145. The source 60 is situated between each first drain 45 and second drain 145, thereby forming two parallel rows of transistors 155, 160 in the direction of the longitudinal extent of the source 60. The second gate electrodes 120 extend perpendicularly to the longitudinal direction of the source 60 and the first drain 45 and the second drain 145, the second gate electrodes 120 being disposed parallel to one another with a uniform spacing preferably of the feature size F.

Typical voltages for programming, for writing to and for reading from the memory cell configuration are reproduced in the table below, the drain 45 being designated by Drain1 and the drain 145 being designated by Drain2.

|  | Drain1 | Drain2 | Gate | Source |
| --- | --- | --- | --- | --- |
| Programming | 12 V | 0 V | 1.5 V | 0 V |
| Erasure | 0 V | 0 V | 12 V | 0 V |
| Reading | 2.5 V | 0 V | 2.5 V | 0 V |

We claim:

1. A method for fabricating a memory cell having a MOS transistor, which comprising the steps of:

providing a substrate;

depositing a first dielectric layer for forming a first gate dielectric on the substrate;

depositing a first electrically conductive layer for forming a first gate electrode on the substrate;

depositing a second dielectric layer on the substrate;

forming a second gate electrode on the substrate such that the second gate electrode has a region penetrating into the substrate;

depositing differently doped regions in the substrate for forming a source, a drain and a channel; and forming a tip on the first electrically conductive layer.

2. The method according to claim 1, which comprises:

forming the first dielectric layer and then the first electrically conductive layer serving as the first gate electrode; and subsequently removing a region from the first electrically conductive layer, an underlying region of the first dielectric layer and also from the substrate.

3. The method according to claim 2, which comprises performing the removing step by at least one etching operation.

4. The method according to claim 3, which comprises performing the etching operation in a region of the substrate which contains a different doping than other regions of the substrate.

5. The method according to claim 2, which comprises:

depositing a filling structure in the region in which the first electrically conductive layer, the first dielectric layer and the substrate have been removed, the filling structure projecting above the first electrically conductive layer;

forming the tip on each side wall of the filling structure projecting above the first electrically conductive layer;

selectively removing the filling structure; and forming a second gate dielectric and at least part of the second gate electrode in the region.

6. The method according to claim 5, which comprises:

depositing a semiconductor layer covering the side walls of the filling structure and oxidizing isotropically the semiconductor layer for forming the tip; and selectively removing an oxidized part of the semiconductor layer resulting in non-oxidized residues of the semiconductor layer remaining which constitute the tip.

* * * * *